United States Patent
Hartner et al.

(10) Patent No.: US 6,559,003 B2
(45) Date of Patent: May 6, 2003

(54) METHOD OF PRODUCING A FERROELECTRIC SEMICONDUCTOR MEMORY

(75) Inventors: Walter Hartner, München (DE); Günther Schindler, München (DE); Marcus Kastner, Ottobrunn (DE); Christine Dehm, München (DE)

(73) Assignee: Infineon Technologies AG, Munich (DE)

( * ) Notice: Subject to any disclaimer, the term of this patent is extended or adjusted under 35 U.S.C. 154(b) by 101 days.

(21) Appl. No.: 09/753,587

(22) Filed: Jan. 3, 2001

(65) Prior Publication Data

US 2001/0015430 A1 Aug. 23, 2001

(30) Foreign Application Priority Data

Jan. 3, 2000 (DE) .......................... 100 00 005

(51) Int. Cl.⁷ .......................... H01L 21/8242
(52) U.S. Cl. .................. 438/253; 438/239; 438/240; 438/241; 438/381; 438/3; 257/295
(58) Field of Search .................. 438/3, 238, 239, 438/240, 241, 253, 393, 250, 381; 257/295, 306, 310, 311

(56) References Cited

U.S. PATENT DOCUMENTS

| | | |
|---|---|---|
| 5,046,043 A | 9/1991 | Miller et al. |
| 5,523,595 A | 6/1996 | Takenaka et al. |
| 5,566,045 A | 10/1996 | Summerfelt et al. |
| 5,624,864 A * | 4/1997 | Arita et al. .................. 438/3 |
| 5,717,236 A * | 2/1998 | Shinkawata .................. 257/306 |
| 5,851,896 A * | 12/1998 | Summerfelt .................. 438/396 |
| 6,046,469 A * | 4/2000 | Yamazaki et al. .......... 257/306 |
| 6,107,136 A * | 8/2000 | Melnick et al. ............. 438/253 |
| 6,121,083 A | 9/2000 | Matsuki |
| 6,246,082 B1 * | 6/2001 | Mitarai et al. .............. 257/295 |
| 6,313,539 B1 * | 11/2001 | Yokoyama et al. ......... 257/761 |

FOREIGN PATENT DOCUMENTS

| | | |
|---|---|---|
| EP | 0 629 002 A1 | 12/1994 |
| EP | 0 915 522 A2 | 5/1999 |
| EP | 0 920 061 A2 | 6/1999 |
| EP | 0 951 058 A2 | 10/1999 |

OTHER PUBLICATIONS

"Box 1: DRAMs Based on Materials with High Permittivity", Physics Today, Jul. 1998, pp. 24–25.

\* cited by examiner

Primary Examiner—Amir Zarabian
Assistant Examiner—Maria Guerrero
(74) Attorney, Agent, or Firm—Laurence A. Greenberg; Werner H. Stemer; Gregory L. Mayback

(57) ABSTRACT

A method of producing a ferroelectric semiconductor memory, includes forming a switching transistor on a semiconductor substrate, applying an insulating layer to the switching transistor and then forming a storage capacitor, with electrodes of platinum and a ferroelectric or paraelectric dielectric, on the insulating layer. In order to protect the dielectric from being penetrated by hydrogen during further process steps, a first barrier layer is embedded into the insulating layer and, after completion of the storage capacitor, a second barrier layer, which bonds with the first barrier layer, is deposited.

20 Claims, 3 Drawing Sheets

METHOD OF PRODUCING A FERROELECTRIC SEMICONDUCTOR MEMORY

BACKGROUND OF THE INVENTION

Field of the Invention

The invention relates to a method of producing a semiconductor component. In particular, the present invention relates to a method of producing a non-volatile memory cell with a switching transistor and a storage capacitor. The capacitor has plates which contain a platinum metal and a ferroelectric or paraelectric material is inserted between the plates as a dielectric.

Conventional microelectronic semiconductor memory components (DRAMs) essentially include a selection transistor or switching transistor and a storage capacitor, in which a dielectric material is inserted between two capacitor plates. Usually oxide or nitride layers which have a maximum dielectric constant of approximately 8 are mostly used as the dielectric. "Novel" capacitor materials (ferroelectrics or paraelectrics) with distinctly higher dielectric constants are required for reducing the size of the storage capacitor and for producing non-volatile memories. Some of those materials are named in a publication entitled "Neue Dielektrika für Gbit-Speicherchips" [New Dielectrics for Gbit Memory Chips] by W. Hönlein. Phys. Bl. 55 (1999). Ferroelectric materials, such as $SrBi_2$ $(Ta,Nb)_2O_9$ (SBT or SBTN), Pb $(Zr,Ti)O_3$ (PZT), or $Bi_4Ti_3O_{12}$ (BTO), may be used as the dielectric between the capacitor plates for producing ferroelectric capacitors for applications in non-volatile memory components with high integration density. However, a paraelectric material, such as, for example, $(Ba,Sr)TiO_3$ (BST), may also be used.

However, the use of those novel dielectrics, ferroelectrics or paraelectrics presents semiconductor process technology with new challenges. Firstly, those novel materials can no longer be combined with the traditional electrode material of polycrystalline silicon. Therefore, inert electrode materials such as, for example, platinum metals or their conductive oxides (for example $RuO_2$), must be used. The reason for that is that, after the ferroelectric material has been deposited, it has to be annealed ("conditioned"), possibly several times, in an oxygen-containing atmosphere at temperatures of approximately 550–800° C. In order to avoid undesired chemical reactions of the ferroelectric material with the electrodes, the latter are therefore mostly made from platinum or some other adequately temperature-stable and inert material, such as another platinum metal (Pd, Ir, Rh, Ru, Os).

Process steps which take place in a hydrogen-containing atmosphere are necessary for the integration of the storage capacitors. For example, for the conditioning of the metallization and of the transistors, annealing in forming gas which is composed of 95% nitrogen ($N_2$) and 5% hydrogen ($H_2$) is necessary. However, the penetration of hydrogen into the processed storage capacitor, i.e. into the dielectric, may lead to a degradation of the oxidic ceramics of the dielectric due to reduction reactions. Furthermore, the plasma-enhanced deposition of intermetal oxides (PECVD) or of the silicon nitride passivation layer may bring about a reduction of the ferroelectric or paraelectric material of the dielectric due to the high hydrogen content in the layers.

In the prior art, it has until now been attempted to solve the problem by depositing a passivation layer onto the storage capacitor. In U.S. Pat. No. 5,523,595, for example, a description is given of a method of manufacturing a semiconductor device in which a switching transistor is formed in a semiconductor substrate, a first insulating layer is deposited on the switching transistor, a ferroelectric storage capacitor coupled to the switching transistor is formed on the first insulating layer, a second insulating layer is applied above the storage capacitor and a barrier layer of TiON, resisting hydrogen penetration, is deposited on the second insulating layer. That previously known barrier layer has the effect of preventing the penetration of hydrogen through the upper electrode of the storage capacitor. However, diffusion of hydrogen through the first insulating layer, and of the lower electrode into the dielectric, continues to be possible and can consequently lead to a degradation of the storage capacitor. On the other hand, it is not possible to dispense with the hydrogen content in the forming gas, since free bonds ("dangling bonds") in the semiconductor, in particular at the interfaces with the electrodes, and in the gate oxide are to be saturated by the hydrogen. In that situation, diffusion of the hydrogen through the lower electrode of the storage capacitor and subsequent damage to the ferroelectric cannot be ruled out.

SUMMARY OF THE INVENTION

It is accordingly an object of the invention to provide a method of producing a semiconductor memory, which overcomes the hereinafore-mentioned disadvantages of the heretofore-known methods of this general type and in which a storage capacitor that uses a ferroelectric or paraelectric material for a dielectric can be adequately protected against penetration of hydrogen.

With the foregoing and other objects in view there is provided, in accordance with the invention, a method of producing a semiconductor component, which comprises:
a) forming a switching transistor on a semiconductor substrate;
b) embedding a first barrier layer, in particular resisting penetration of hydrogen, in an insulating layer and applying the insulating layer to the switching transistor;
c) forming a storage capacitor of a lower electrode, an upper electrode and a metal-oxide-containing layer deposited between the lower and upper electrodes, coupling the storage capacitor to the switching transistor and applying the storage capacitor to the insulating layer;
d) removing the insulating layer to a certain depth outside the storage capacitor in a vertical etching step, while exposing the first barrier layer to the outside; and
e) applying a second barrier layer, in particular resisting penetration of hydrogen, to the storage capacitor, to the insulating layer and to the first barrier layer.

The metal-oxide-containing layer in this case is preferably a ferroelectric or paraelectric material.

In accordance with another mode of the invention, the switching transistor is connected to the storage capacitor in such a way that, after the insulating layer is applied, a contact hole is etched into the latter as far as a terminal region of the switching transistor, for example a drain region of an MOS switching transistor, and is filled with a conductive material, and the lower electrode of the storage capacitor is subsequently applied at least partially to the contact hole.

In accordance with a further mode of the invention, before the contact hole is filled, it is lined on its inner wall surfaces with a third barrier layer, in particular resisting the penetration of hydrogen. As a result, the hydrogen can additionally be prevented from diffusing into the contact hole filled with the conductive material ("plug") and penetrating through the conductive material of the contact hole and the lower electrode into the metal-oxide-containing layer. Consequently, the storage capacitor being produced is completely encapsulated by barrier layers.

In accordance with an added mode of the invention, in step d), the first insulating layer is removed to the depth of the first barrier layer, and it is possible, if appropriate, for the first barrier layer to be used as an etching stop layer. As an alternative to this, also in step d), the first insulating layer may be removed to a depth below the first barrier layer.

In accordance with an additional mode of the invention, the first barrier layer is produced from $Si_3N_4$, and a chemical gas phase deposition at low pressure (LPCVD) produces particularly good results. $ZrO_2$ or $SiO_2/ZrO_2$ may also be chosen as the material of the first barrier layer. The materials which are known per se in the prior art $Al_2O_3$, $TiO_2$, $Ta_2O_5$ may also be used as the material for the first barrier layer.

In accordance with yet another mode of the invention, in order to provide the third barrier layer, with which the inner wall surfaces of the contact hole etched into the first insulating layer are lined, in principle the same materials may be used as for the first barrier layer. If $Si_3N_4$ is chosen as the material for the third barrier layer, in this case too, the deposition preferably takes place by LCVD.

In accordance with yet a further mode of the invention, the second barrier layer, deposited on the storage capacitor, is made up of an $SiO_x$—SiON—$Si_3N_4$ combination of layers. An $SiO_x$ layer is first grown on, preferably by CVD (chemical vapor deposition), an SiON layer is subsequently deposited, likewise preferably by CVD, and finally an $Si_3N_4$ layer is applied, preferably by LPCVD.

In accordance with a concomitant mode of the invention, in order to protect the ferroelectric or paraelectric material of the dielectric, as this takes place, from the relatively large amounts of hydrogen which occur during the LPCVD deposition of the $Si_3N_4$ layer, an oxidic or nitridic barrier layer (X layer) may be additionally deposited below the combination of layers or between individual layers of the combination of layers. The layer structure of the combination of layers is consequently, for example, X—$SiO_2$—SiON—$Si_3N_4$ or $SiO_2$—X—SiON—$Si_3N_4$. $Ta_2O_5$, $Bi_2O_3$, $TiO_2$, $Al_2O_3$, $Nb_2O_5$, MgO, $V_2O_5$, $CeO_2$, $Y_2O_3$, $ZrO_2$, BN, AlN and all rare earth oxides may be used, for example, as the material for the X layer. Furthermore, in order to repair any damage to the ferroelectric or paraelectric as a consequence of the CVD deposition of the silicon oxide layer, an annealing step is also preferably performed after the SiOX deposition.

Other features which are considered as characteristic for the invention are set forth in the appended claims.

Although the invention is illustrated and described herein as embodied in a method of producing a ferroelectric semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
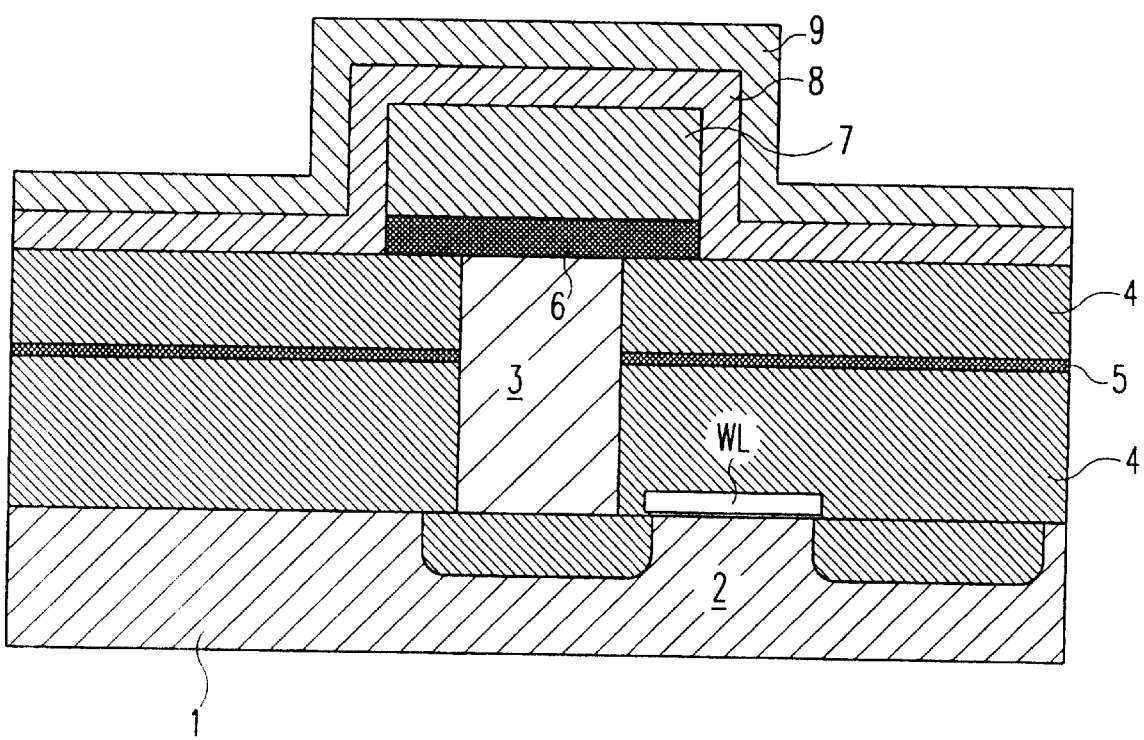
FIG. 1 is a diagrammatic, sectional view of a semiconductor component produced according to the invention after carrying out method step c)

Referring now to the figures of the drawings in detail and first, particularly, to FIG. 1 thereof, there is seen an exemplary embodiment in which initially an MOS switching transistor 2 is produced on a semiconductor substrate 1 (for example of silicon) by forming a drain region and a source region by doping. A channel which is provided therebetween can be controlled in its conductivity by a gate disposed above the channel. The gate may be formed by a word line WL of the memory component or be connected to the latter. The source region is connected to a bit line BL of the memory component. The MOS switching transistor 2 is subsequently covered with a planarizing insulating layer 4, usually of an oxide, such as $SiO_2$ (TEOS), or BPSG (borophosphorus silicate glass).

According to the invention, a first barrier layer 5 is embedded into the insulating layer 4. Accordingly, a first sublayer of the insulating layer 4 is initially applied, then the barrier layer 5 is deposited onto this first sublayer and finally a second sublayer of the insulating layer 4 is applied to the barrier layer 5. A material which is as impenetrable as possible with respect to hydrogen is chosen for the barrier layer 5. Silicon nitride, in particular $Si_3N_4$, which can be deposited with particularly good quality and freedom from pores by chemical vapor-phase deposition at low pressure (LPCVD), is very well suited for this purpose. However, another nitride layer or another layer acting as an $H_2$ barrier may also be used.

Subsequently, a contact hole 3 is vertically etched, above the drain region of the MOS switching transistor 2, into the layer structure formed by the insulating layer 4 and the barrier layer 5. The contact hole 3 is filled with a conductive material, such as doped, polycrystalline silicon. An oxidation barrier 6 is subsequently applied to the filled contact hole 3.

Subsequently, a storage capacitor is formed on the insulating layer 4 by initially applying a lower electrode 7 of platinum or some other platinum metal or a conductive oxide thereof over the contact hole 3 and structuring it in a mesa form as represented. The lower electrode 7 is consequently electrically connected to the drain region of the MOS switching transistor 2 through the contact hole 3 filled with the conductive polycrystalline silicon. A dielectric layer 8 of a ferroelectric or paraelectric material, which forms a capacitor dielectric, is then deposited onto the lower electrode 7. This layer 8 covers the structured lower electrode 7 completely on all sides and extends in the lateral direction in a step-shaped manner beyond the lower electrode 7. An upper electrode 9 of platinum or some other platinum metal or a conductive oxide thereof is deposited onto the dielectric layer 8. The upper electrode 9 is likewise deposited in such a way that it covers the dielectric layer 8 completely on all sides, and consequently it extends likewise in a step-shaped manner in the lateral direction on both sides of the structured lower electrode 7.

This completes the semiconductor component as represented in FIG. 1.

A vertical structuring of the storage capacitor in mesa form is subsequently carried out. This may take place according to two different embodiments, which are represented with reference to FIGS. 2a and 2b.

Figure 2A:
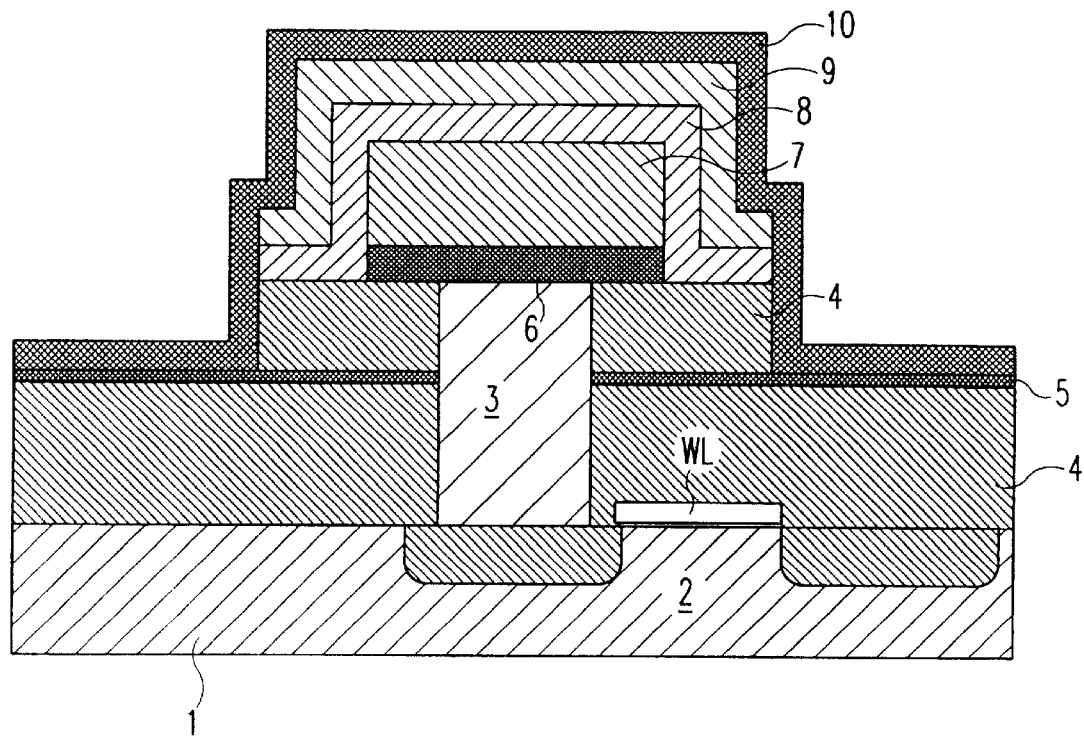
FIG. 2a is a sectional view of a semiconductor component produced according to the invention after carrying out method step d) (first embodiment)

In a first embodiment illustrated in FIG. 2a, a vertical mesa structure is etched around the storage capacitor into the insulating layer 4. The vertical etching operation is carried out exactly as far as the barrier layer 5. If appropriate, the barrier layer 5 may at the same time assume the function of an etching stop layer in this case. This vertical etching step has the result of exposing the upper surface of the barrier layer 5 outside the etched mesa structure to the outside. A second barrier layer 10 is then applied to the structure which was obtained.

Figure 2B:
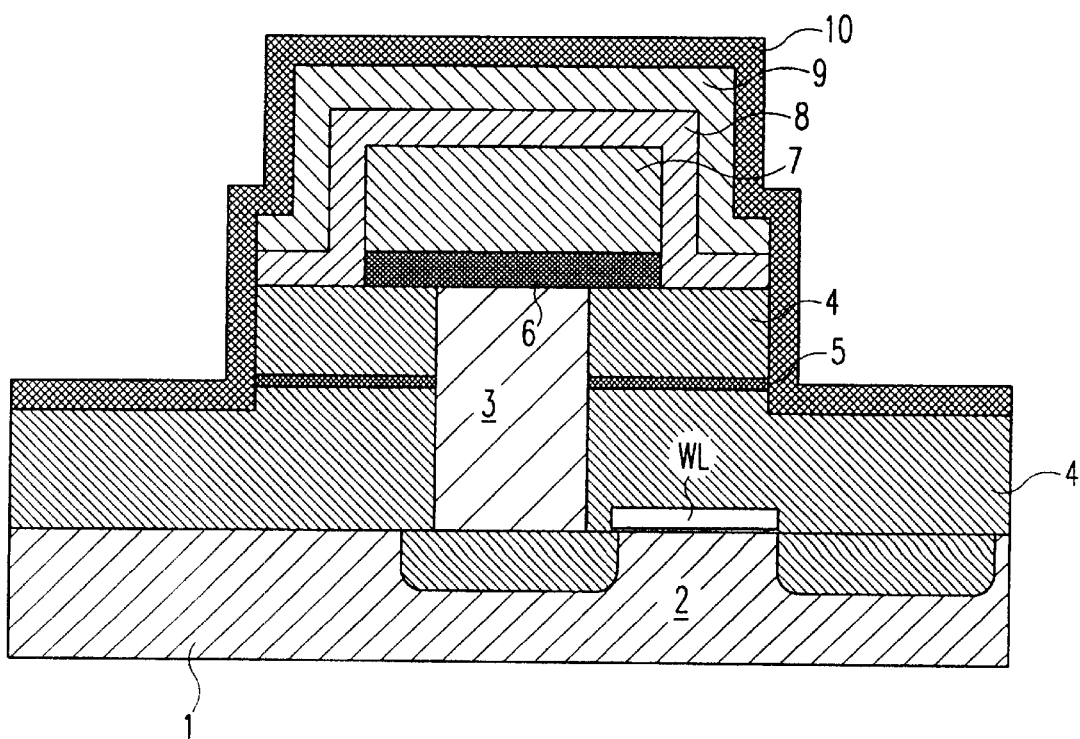
FIG. 2b is a sectional view of a semiconductor component produced according to the invention after carrying out method step d) (second embodiment)

In the second embodiment illustrated in FIG. 2b, a structure in mesa form is likewise produced around the storage capacitor by a vertical etching step. In this case, however, the vertical etching operation into the insulating layer 4 is carried out beyond the barrier layer 5, so that the barrier layer 5 is entirely removed outside the mesa structure. The etching operation takes place to a certain depth below the barrier layer 5 and is then stopped. The second barrier layer 10 is then applied to the structure which is obtained. Therefore, no etching stop is necessary on the barrier layer 5 in the second embodiment. This is, however, at the expense of an increase in the height of the topology, i.e. of the etched mesa structure.

In both embodiments, the application of the second barrier layer 10 has the effect of connecting it to the first barrier layer 5 over a certain portion. This portion runs on a closed path around the mesa structure and to a certain extent forms an outer contour in a lower region of the etched mesa structure. In the first embodiment, on one hand, the second barrier layer 10 is applied completely over the first barrier layer 5 which is still completely preserved in the region outside the mesa structure. In the second embodiment, on the other hand, the contacting takes place at a narrow portion at which the first barrier layer 5 is exposed to the outside on a vertically etched edge.

The second barrier layer 10 is formed by a combination of layers in which initially a first layer of $SiO_x$, then a second layer being formed of SiON and finally a third layer of $Si_3N_4$ are applied. The first two layers may be formed by CVD (chemical vapor deposition), while the $Si_3N_4$ layer may be formed by LPCVD (low-pressure chemical vapor deposition, chemical vapor-phase deposition at low pressure). In order to protect the dielectric of the storage capacitor from the relatively large amounts of hydrogen ($H_2$) which occur during the LPCVD deposition of the $Si_3N_4$ layer, an additional oxidic or nitridic barrier layer (X layer) may be deposited. This X layer may either be applied as a first layer, that is to say even before the deposition of the $SiO_2$ layer, or within the combination of layers. Consequently, a layer structure of the form X—$SiO_2$—SiON—SiN or $SiO_2$—X—SiON—SiN may be chosen, for example, as the combination of layers. The X layer may also be applied after formation of the SiON layer. Any thermally stable, non-conducting oxide or nitride such as, for example, $Ta_2O_5$, $Bi_2O_3$, $TiO_2$, $Al_2O_3$, $Nb_2O_5$, MgO, $V_2O_5$, $CeO_2$, $Y_2O_3$, $ZrO_2$, BN, AlN and all rare earth oxides may be used as the material of the oxidic or nitridic X barrier layer. After the CVD deposition of the silicon oxide layer, an annealing step may be carried out in order to repair any damage to the capacitor dielectric as a consequence of this deposition.

Figure 3:
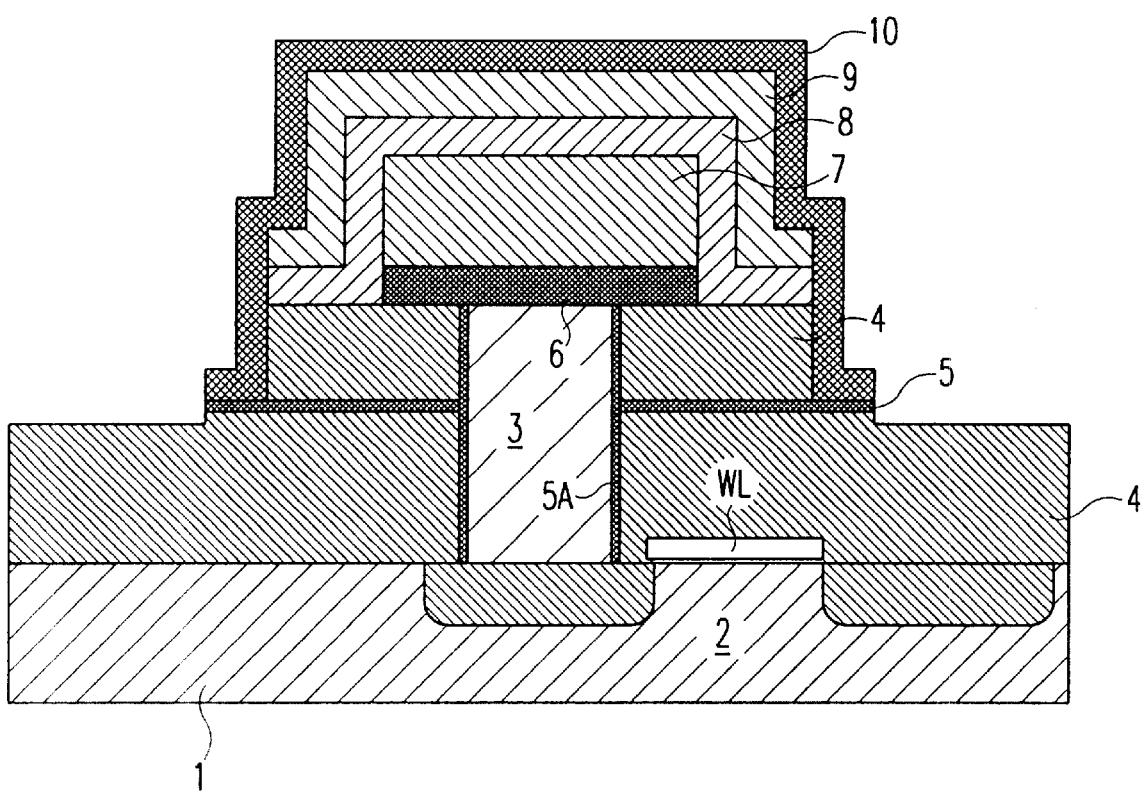
FIG. 3 is a sectional view of a semiconductor component produced according to the invention after carrying out method step e) (first embodiment).

Finally, a semiconductor component completed by the process according to the invention is represented in FIG. 3. As can be seen, this has been created by a method performed on the basis of the first embodiment according to the invention illustrated in FIG. 2a. The barrier layers 5 and 10 located outside the mesa structure have been removed in a further etching step.

However, the semiconductor component represented in FIG. 3 also differs in a further feature from the embodiments previously represented. In the embodiment of FIG. 3, the contact hole 3 is provided with a third barrier layer 5A, by which the hydrogen is prevented from being able to penetrate through the insulating layer 4 into the conductive material of the contact hole 3 and from being able to diffuse from there upward into the storage capacitor. The application of the third barrier layer 5A is carried out directly after the etching of the contact hole. The third barrier layer 5A, like the first barrier layer 5, is formed of $Si_3N_4$ and is furthermore preferably likewise produced by the LPCVD process. The third barrier layer 5A completely covers inner wall surfaces of the contact hole 3. Once the contact hole 3 has been lined in such a way by the third barrier layer 5A, the contact hole 3 is filled with the conductive material, such as doped, polycrystalline silicon.

The method according to the invention therefore succeeds in completely encapsulating the storage capacitor in the barrier layers 5, 5A and 10, and consequently in preventing the hydrogen that is always present in the process steps after the storage capacitor is formed from penetrating into the component and being able to cause damage to the ferroelectric or paraelectric material of the capacitor dielectric. In many cases, it will be adequate to form the barrier layers 5 and 10, since the contact hole 3 itself forms only a very narrow diffusion path for the hydrogen. However, to achieve complete encapsulation, the third barrier layer 5A may also be applied to the inner wall surfaces of the contact hole 3 in the way represented and, consequently, encapsulation of the storage capacitor can be completed.

We claim:

1. A method of producing a semiconductor component, which comprises:
    a) forming a switching transistor having a source region and a drain region on a semiconductor substrate;
    b) embedding a first barrier layer in an insulating layer and applying the insulating layer to the switching transistor;
    b1) etching a contact hole into the insulating layer as far as one of the source and the drain regions of the switching transistor;
    b2) filling the contact hole with a conductive material;
    c) forming a storage capacitor of a lower electrode, an upper electrode and a metal-oxide-containing layer deposited between the lower and upper electrodes, applying the storage capacitor to the insulating layer and connecting the switching transistor to the storage capacitor by applying the lower electrode over the contact hole;
    d) removing the insulating layer to a certain depth outside the storage capacitor in a vertical etching step, while exposing the first barrier layer to the outside; and
    e) applying a second barrier layer to the storage capacitor, to the insulating layer and to the first barrier layer.

2. The method according to claim 1, wherein the first barrier layer resists penetration of hydrogen.

3. The method according to claim 1, wherein the second barrier layer resists penetration of hydrogen.

4. The method according to claim 1, which further comprises removing the insulating layer in step d) to a depth below the first barrier layer.

5. The method according to claim 1, which further comprises selecting the first barrier layer from the group consisting of $ZrO_2$; $SiO_2$—$ZrO_2$ deposited in that sequence; $Al_2O_3$; $TiO_2$; and $Ta_2O_5$.

6. The method according to claim 1, which further comprises forming the second barrier layer by a combination of layers of layer materials $SiO_x$—$Si_3N_4$ deposited in that sequence.

7. The method according to claim 1, which further comprises producing at least one of the electrodes in step c) from a material selected from the group consisting of platinum, another platinum metal and an oxide thereof.

8. The method according to claim 1, which further comprises lining inner wall surfaces of the contact hole with a third barrier layer, before the contact hole is filled.

9. The method according to claim 1, which further comprises removing the insulating layer in step d) to a depth of the first barrier layer.

10. The method according to claim 1, which further comprises forming the first barrier layer of $Si_3N_4$.

11. The method according to claim 1, which further comprises forming the second barrier layer by a combination of layers of layer materials $SiO_x$—$SiON$—$Si_3N_4$ deposited in that sequence.

12. The method according to claim 8, wherein the third barrier layer resists penetration of hydrogen.

13. The method according to claim 8, which further comprises forming the third barrier layer of $Si_3N_4$.

14. The method according to claim 9, which further comprises using the first barrier layer as an etching stop layer.

15. The method according to claim 10, which further comprises depositing the first barrier layer by chemical vapor-phase deposition at low pressure (LPCVD).

16. The method according to claim 13, which further comprises depositing the third barrier layer of $Si_3N_4$ by a LPCVD process.

17. The method according to claim 11, which further comprises depositing an additional barrier layer selected from the group consisting of an oxide and a nitride, before deposition of the $Si_3N_4$ layer.

18. The method according to claim 11, which further comprises depositing an additional barrier layer of a material selected from the group consisting of $Ta_2O_5$, $Bi_2O_3$, $TiO_2$, $Al_2O_3$, $Nb_2O_5$, MgO, $V_2O_5$, $CeO_2$, $Y_2O_3$, $ZrO_2$, BN, AlN and a rare earth oxide, before deposition of the $Si_3N_4$ layer.

19. The method according to claim 11, which further comprises forming at least one of the $SiO_x$ layer and the SiON layer by a CVD process.

20. The method according to claim 11, which further comprises forming the $Si_3N_4$ layer by a LPCVD process.

* * * * *